United States Patent
Jeng et al.

(10) Patent No.: US 8,355,122 B2
(45) Date of Patent: Jan. 15, 2013

(54) NON-CONTACTING ALIGNING METHOD FOR PLANES IN THREE-DIMENSIONAL ENVIRONMENT

(76) Inventors: Chien-Chung Jeng, Taichung (TW); Chiu-Hsien Wu, Taichung (TW)

(*) Notice: Subject to any disclaimer, the term of this patent is extended or adjusted under 35 U.S.C. 154(b) by 202 days.

(21) Appl. No.: 12/846,856

(22) Filed: Jul. 30, 2010

(65) Prior Publication Data
US 2012/0026486 A1    Feb. 2, 2012

(51) Int. Cl.
G01B 11/26    (2006.01)
G01B 11/14    (2006.01)
G01B 11/06    (2006.01)
G01B 11/02    (2006.01)
G01B 11/04    (2006.01)
G01C 1/00    (2006.01)

(52) U.S. Cl. ........ 356/138; 356/625; 356/634; 356/635; 356/636

(58) Field of Classification Search .................. 356/138, 356/614, 399
See application file for complete search history.

(56) References Cited

U.S. PATENT DOCUMENTS

| | | | | |
|---|---|---|---|---|
| 4,373,282 A | * | 2/1983 | Wragg | 40/546 |
| 4,405,235 A | * | 9/1983 | Rossiter | 356/246 |
| 5,379,106 A | * | 1/1995 | Baldur | 356/623 |
| 7,009,197 B2 | * | 3/2006 | Kwak et al. | 250/559.29 |
| 2009/0296057 A1 | * | 12/2009 | Ruan | 355/52 |

* cited by examiner

*Primary Examiner* — Gregory J Toatley
*Assistant Examiner* — Shawn Decenzo

(57) ABSTRACT

A non-contacting aligning method for planes in a three-dimensional environment is disclosed. The method includes: projecting a light beam in a predetermined incident angle onto a transparent first object and an opaque second object that are facing each other; and calculating a distance between the first and second objects basing on the tangent trigonometric function of the incident angle of the light beam.

7 Claims, 5 Drawing Sheets

NON-CONTACTING ALIGNING METHOD FOR PLANES IN THREE-DIMENSIONAL ENVIRONMENT

BACKGROUND OF THE INVENTION

1. Technical Field

The present invention relates to methods for measuring overlay errors of facing objects, and more particularly to a non-contacting method for detecting overlay errors in X and Y axes between two objects facing each other, and detecting a vertical distance between the two objects (in Z axis) as well as parallelism therebetween.

2. Description of Related Art

As to the conventional lithography process, in course of transferring a pattern of a photo mask to a circuit substrate and transferring a pattern predefined on a photo mask to a wafer, measures for error measuring and object aligning are implemented so as to ensure accurate transfer of the patterns. On this note, X-Y positioning, Z positioning, and parallelism between two objects to be mutually overlaid are important. In addition to the lithography process, in course of installing a probe to a superconducting quantum interference microscope (SQUID Microscope), the relative distance and the parallelism between the probe and the assay sample have to be accurately controlled in order to ensure proper sensitivity of the device.

Herein the lithography process is described as an example for illustrating how the prior art deals with the need of three-axis positioning.

Using image capturing devices on the Z axis to monitor overlay between XY-axis marks of overlaid objects is known. Therein, a movable camera may be used to monitor images of overlaid objects in its focal plane and thereby achieve the Z-axis monitoring process. During the process, once the focus changes in the focal plane, it indicates that an inclining angle exists between the two facing objects. However, this known approach is infeasible to get the inclining angle accurately when the image definition of the camera is poor.

Alternatively, two or more image capturing devices are arranged to take images from different view angles for comparison in order to obtain the distance in the Z axis. Nevertheless, this approach needs complicated calculation and operation, yet is defective in accurately giving the inclining angle between overlaid objects.

SUMMARY OF THE INVENTION

One objective of the present invention is to provide a non-contacting aligning method for planes in a three-dimensional environment. This method adopts a non-contacting means to monitor a distance and parallelism between two objects facing each other, in conjunction with X-Y axis monitoring, to fully align the objects in a three-dimensional environment.

The non-contacting means of the present invention primarily involves projecting a slantwise incident light beam to objects facing each other, calculating a distance between the two facing objects basing on an incident angle of the light beam and its tangent trigonometric function, and determining parallelism between the objects by checking parallelism between projected light strokes on an X-Y plane. When there is an included angle appearing between the two objects, an included angle appears between two said adjacent light strokes. The inclining angle between the two objects can be derived basing on the included angle and a trigonometric function. A known adjusting means may use the result to modify one of the objects so as to achieve the purposes of three-axis positioning and parallelism between the overlaid objects.

A device for realizing the foregoing non-contacting means may comprises an image capturing device, a light-beam generating device and a computing device. The image capturing device is arranged on the Z axis of a first object and a second object that faces each other. The light-beam generating device generates a light beam that is projected onto the first object and the second object in a predetermined angle. The second object reflects the light beam to project a light stroke on the first object. Images of the light strokes on the first object and the second object are captured by the image capturing device. The computing device determines a distance between the two light strokes on the first object and uses a given incident angle of the light beam, by applying a tangent trigonometric function of the incident angle, to figure out the vertical distance between the first object and the second object. In addition, parallelism between the light strokes on the first and second objects can be used to determine whether the first and second objects are parallel with each other. Also, an inclining angle of the first object with respect to the second object can be calculated basing on the included angle between the light strokes on the first object and the second object and a trigonometric function so that the first object and the second object can be adjusted to have parallelism by using a known adjusting means according to the foregoing results. The image capturing device may also serve to take X-Y planar images of the first and second objects for facilitating determining alignment between overlay marks of the objects. Thereby, the non-contacting means of the present invention is effective in aligning planes in a three-dimensional environment.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
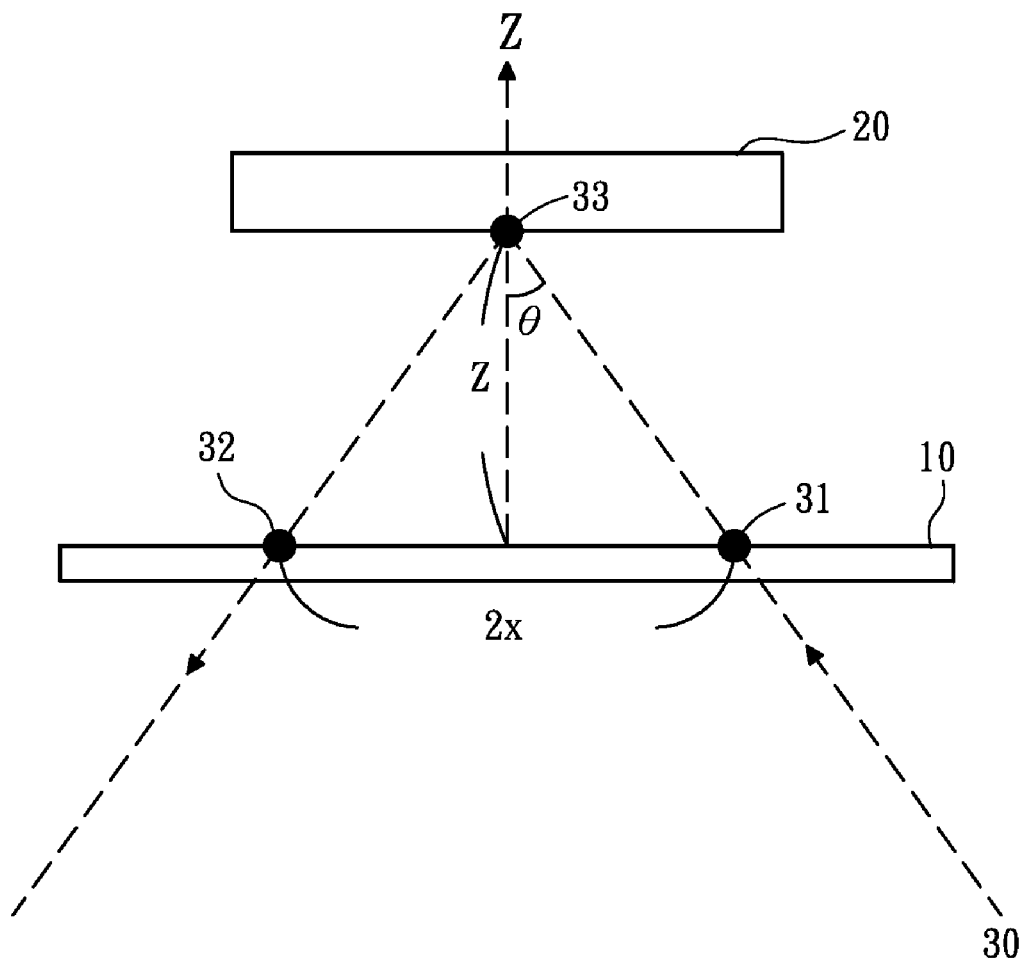
FIG. 1 is a lateral view of overlaid objects for illustrating how to calculate a vertical distance between the objects.

Referring to FIG. 1, a way to calculate a vertical distance Z between two parallel matters, a first object 10 and a second object 20, is illustrated. A slantwise incident light beam 30 is projected onto the transparent first object 10 and the reflective second object 20 in a predetermined angle (θ). Then the second object 20 further reflects the light beam to the first object 10. Therefore, there are an incident light stroke 31 and a reflected light stroke 32 on the first object 10 while there is an incident light stroke 33 on the second object 20. Assuming that a distance between the incident light stroke 31 and the reflected light stroke 32 on the first object 10 is 2x, the vertical distance Z between the first object 10 and the second object 20 can be derived from the following Equation 1:

$$\tan\theta = \frac{x}{z} \quad \text{Equation 1}$$

Figure 2:
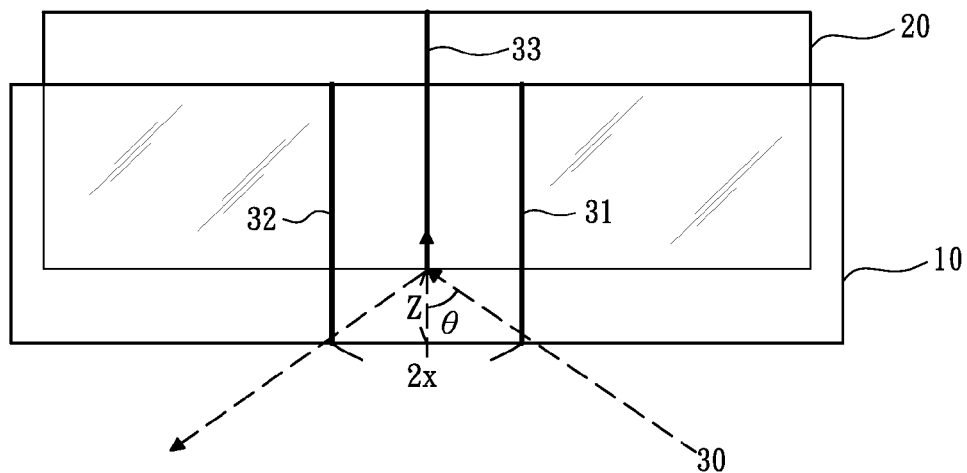
FIG. 2 is a front top view of FIG. 1 showing a route of a light beam passing the overlaid objects.
Figure 3:
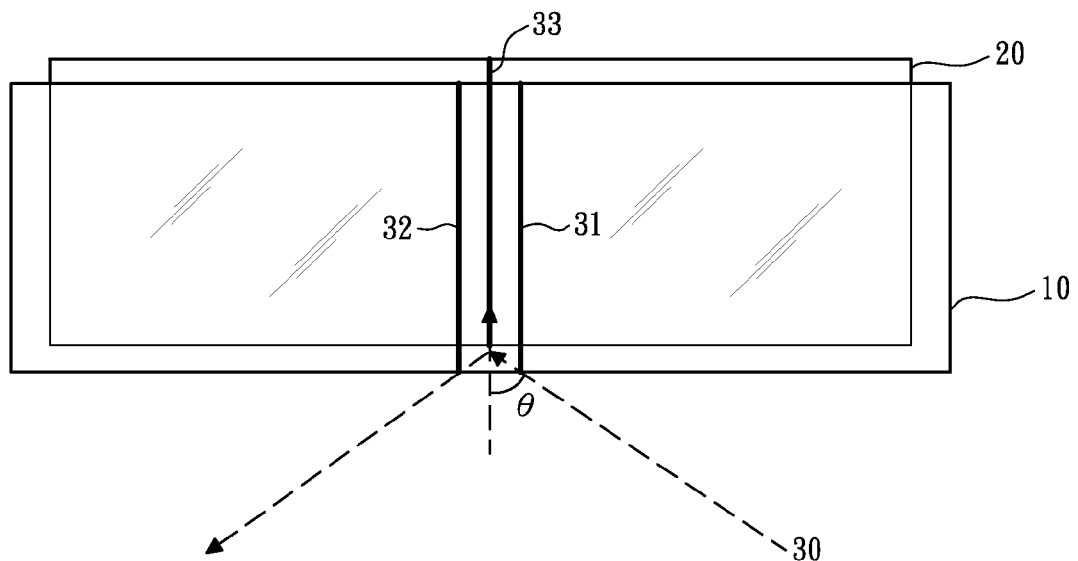
FIG. 3 is a front top view of FIG. 1 showing the route of the light beam changed when a distance between the objects changes.

Referring to FIG. 2 and FIG. 3, the drawings show how the three light strokes 31, 32 and 33 locate on the first object 10 and the second object 20 and how a distance between the incident light stroke 31 and the reflected light stroke 32 on the first object 10 changes when the distance Z between the first object 10 and the second object 20 changes. The greater distance Z is, the greater the distance between the incident light stroke 31 and the reflected light stroke 32 is, vice versa.

Figure 4:
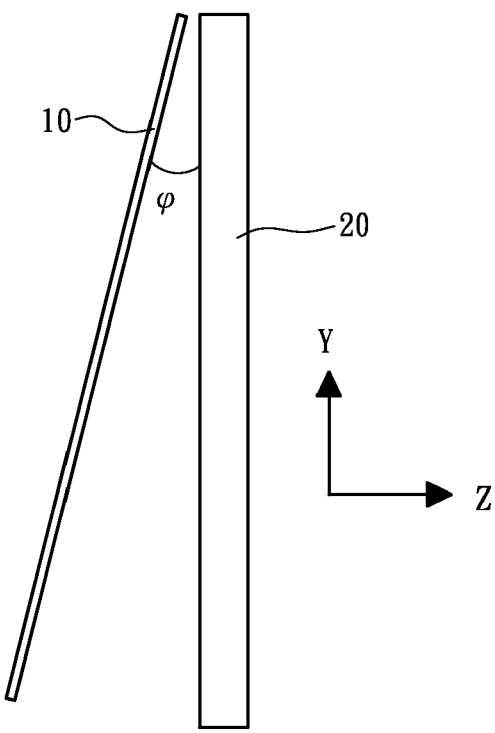
FIG. 4 is a lateral view of the objects with an inclining angle therebetween.
Figure 5:
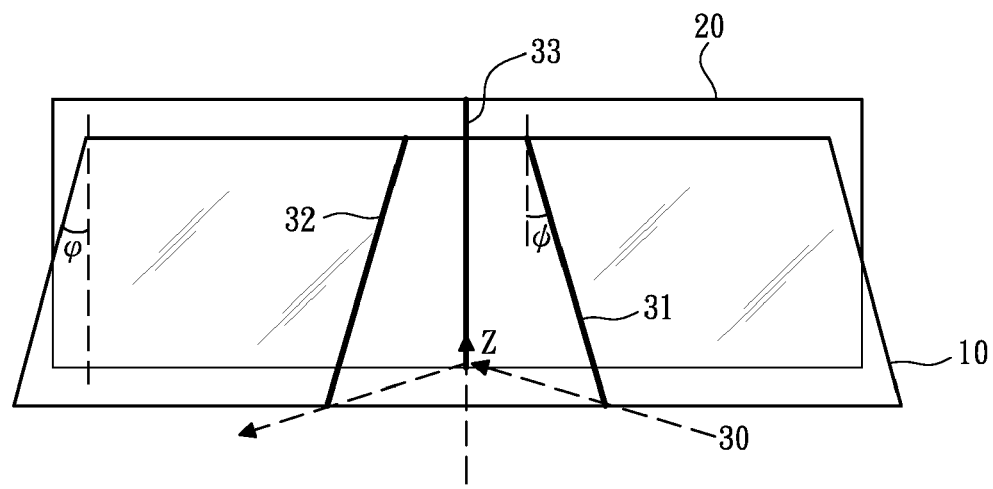
FIG. 5 is a front top view of FIG. 4 showing a route of a light beam with presence of the inclining angle between the objects.

Referring to FIG. 4 and FIG. 5, the drawings show variation among the three light strokes 31, 32 and 33 in response to inclination of the first object 10 with respect to the second object 20. When an inclining angle φ exists between the first object 10 and the second object 20, an included angle φ exists between the light stroke 31, 32 on the first object 10 and the incident light stroke 33 on the second object 20, and the inclining angle φ can be derived from the following Equation 2:

$$\tan\theta = \frac{\tan\phi}{\tan\varphi} \cong \frac{\phi}{\varphi} \quad \text{Equation 2}$$

A known adjusting means may use the distance Z to modify the first object 10 and the second object 20 and achieve a desired value of the distance Z. Alternatively, the derived inclining angle φ may be used to adjust the first object 10 in order to make it become parallel with the second object 20.

Figure 6:
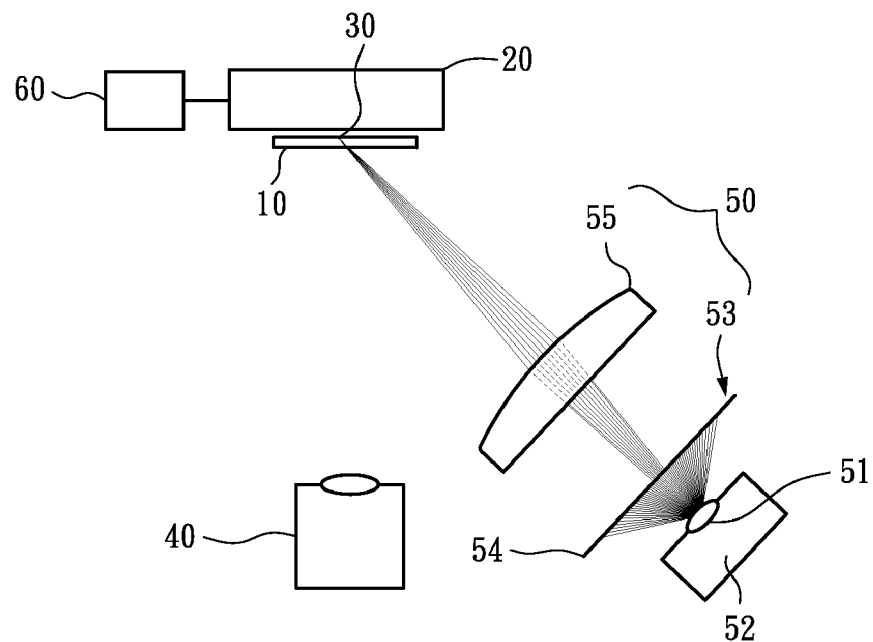
FIG. 6 and FIG. 7 depict a device for achieving the present invention.
Figure 7:
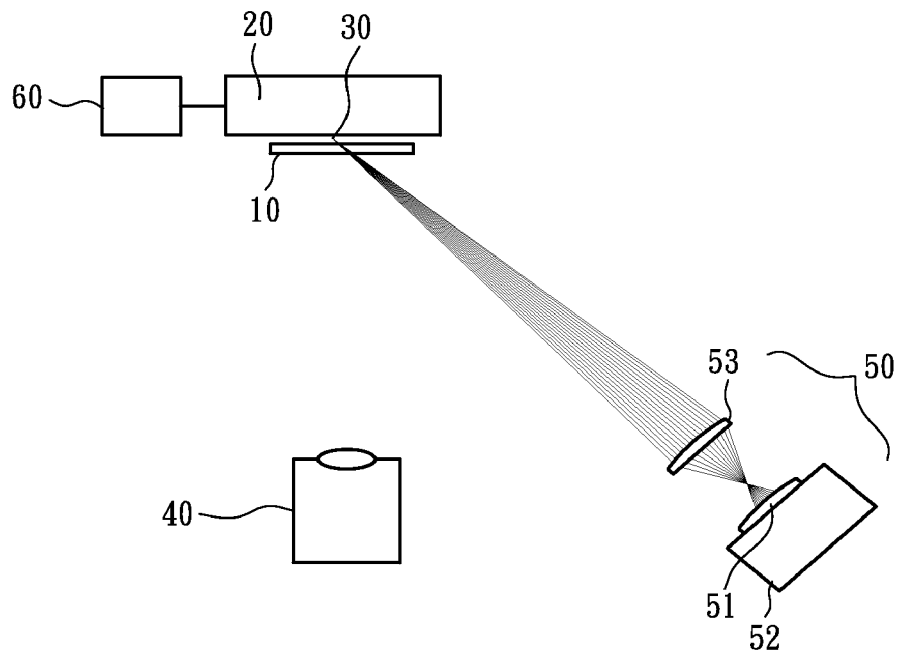

Referring to FIG. 6 and FIG. 7, a device for realizing the method of the present invention is illustrated. The device comprises an image capturing device 40, a light-beam generating device 50 and a computing device 60 coupled to the image capturing device 40. The image capturing device 40 is arranged on the Z axis of the first object 10 and the second object 20. The light-beam generating device 50 generates and projects the aforementioned light beam 30. The incident light stroke 31 and the reflected light stroke 32 on the first object together with the incident light stroke 33 on the second object 20 are captured as images by the image capturing device 40. The computing device 60 then uses the captured images to determine a distance between the incident light stroke 31 and the reflected light stroke 32 on the first object 10, and further applies a given incident angle θ of the light beam to Equation 1 to derive the distance Z between the first object 10 and the second object 20. The light stroke 33 on the second object 20 and the light strokes 31, 32 are considered to determine whether the first and second objects are in parallelism. When the first and second objects are not parallel with each other, the computing device 60 uses Equation 2 to figure out the inclining angle φ of the first object 10 with respect to the second object 20.

The light-beam generating device 50 primarily comprises a light source 51, an angle adjuster 52 on which the light source 51 is installed and adjusted in its incident angle, and an auxiliary device 53 that shapes light from the light source 51 into a beam of a predetermined width (about 500 μm). The light source 51 may be an LED unit, and the auxiliary device 53 is provided with a slot 54, so that light of the LED unit passes through the slot 54 before focused by a convex 55 into the light beam 30 as wide as about 500 μm to be projected on the first object 10 and the second object 20. The light source 51 may alternatively be a laser unit, and the auxiliary device 53 is a lenticular lens, so as to present the light beam as wide as about 60 μm for the first object 10 and the second object 20.

As the transparent first object 10 in the embodiment is glass of high transparency, for facilitating clear presentation of the light strokes 31, 32 on the transparent first object 10 (i.e. the glass), the first object 10 may have its surface ground with aluminum oxide powders into an imaging surface 11, which has reduced transparency and is partially reflective.

In another embodiment of the present invention, the first object 10 may have its surface coated to form a partially reflective imaging surface 11, so that the incident light stroke 31 and the reflected light stroke 32 can show on the imaging surface 11 clearly.

Figure 8:
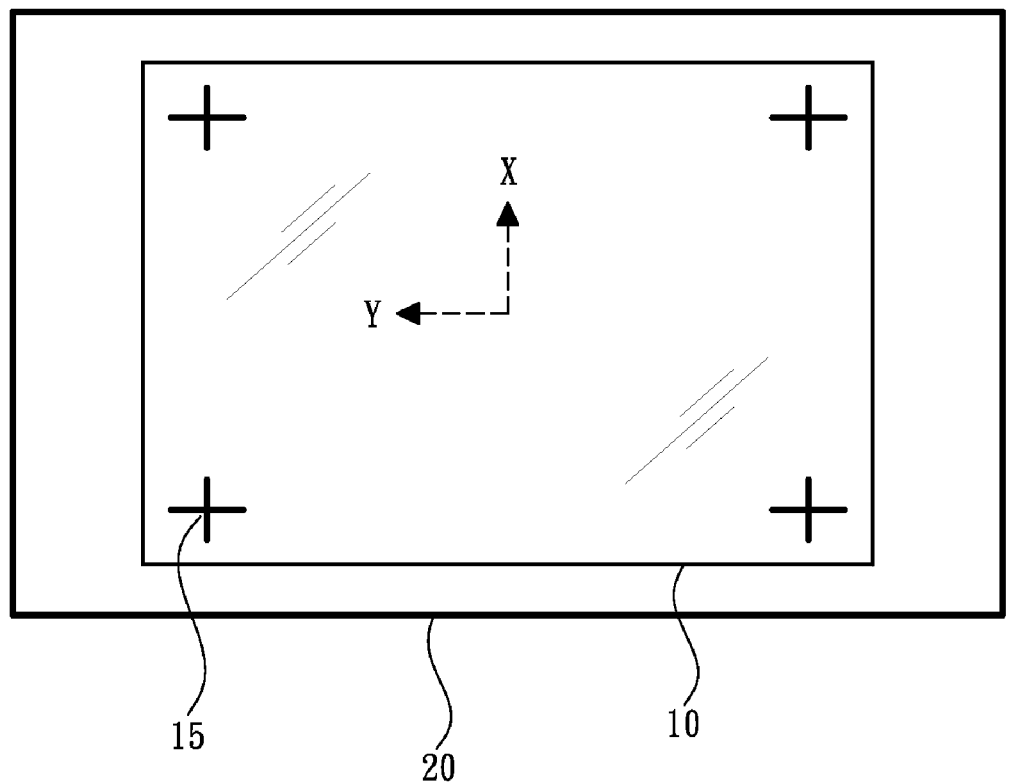
FIG. 8 is a top view of overlaid objects whose X-Y planes are provided with marks.

Referring to FIG. 8, the image capturing device 40 may also serve to take X-Y planar images of the first object 10 and the second object 20. The images thus are useful in determining alignment between marks 15 of the objects. Thereby, the device can be used to realize the non-contacting aligning method for planes in a three-dimensional environment as claimed by the present invention.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A non-contacting aligning method for planes in three-dimensional environment, comprising steps of
    providing a first object that is transparent;
    providing a second object that is opaque;
    projecting a streak of light in a predetermined incident angle so that the streak of light pierces through the first object while forming an incident light bar on a surface of the first object and then the incident light bar forms a light bar on a surface of the second object, wherein the light bar of the second object is reflect to and pierces through the first object so as to form an emergent light bar on the surface of the first object;
    providing an image capturing device arranged on a normal of the second object; and
    detecting distance between the light bars and calculating the vertical distances between the first and second objects at different points on the light bars.

2. The method of claim 1, further comprising calculating an inclining angle of the first object with respect to the second object basing on an included angle between any of the light bars of the first object and the light bar of the second object presented in a plane.

3. The method of claim 2, wherein an approximation of the inclining angle is derived by using an equation of:

$$\text{inclining angle} \approx \frac{\text{included angle}}{\tan(\text{predetermined incident angle})}.$$

4. The method of claim 2, wherein a ruth value of the inclining angle is derived by using an equation of:

$$\tan(\text{inclining angle}) = \frac{\tan(\text{included angle})}{\tan(\text{predetermined incident angle})}.$$

5. The method of claim 1, wherein the transparent first object has a partially reflective imaging surface.

6. The method of claim 5, wherein the imaging surface of the first object is made by grinding a surface of the first object with aluminum oxide powders.

7. The method of claim 5, wherein the imaging surface of the first object is made by coating a surface of the first object.

* * * * *